(12) United States Patent
Chaves et al.

(10) Patent No.: US 11,532,526 B2
(45) Date of Patent: Dec. 20, 2022

(54) DOUBLE-SIDED HERMETIC MULTICHIP MODULE

(71) Applicant: SCHLUMBERGER TECHNOLOGY CORPORATION, Sugar Land, TX (US)

(72) Inventors: Cleverson Souza Chaves, Clamart (FR); Francois Barbara, Clamart (FR)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 16/075,359

(22) PCT Filed: Feb. 3, 2017

(86) PCT No.: PCT/US2017/016361
§ 371 (c)(1),
(2) Date: Aug. 3, 2018

(87) PCT Pub. No.: WO2017/136632
PCT Pub. Date: Aug. 10, 2017

(65) Prior Publication Data
US 2019/0348334 A1    Nov. 14, 2019

(30) Foreign Application Priority Data

Feb. 4, 2016  (EP) ..................... 16290025

(51) Int. Cl.
*H01L 23/13*     (2006.01)
*H01L 23/04*     (2006.01)
(Continued)

(52) U.S. Cl.
CPC .............. *H01L 23/04* (2013.01); *H01L 23/10* (2013.01); *H01L 23/28* (2013.01); *H01L 23/60* (2013.01); *H01L 2224/2919* (2013.01); *H01L 2224/48227* (2013.01); *H01L 2224/8385* (2013.01); *H01L 2924/14* (2013.01);
(Continued)

(58) Field of Classification Search
CPC ....... H01L 25/072; H01L 23/10; H01L 23/28; H01L 23/04
See application file for complete search history.

(56) References Cited

U.S. PATENT DOCUMENTS

2002/0050371 A1  5/2002  Czjakowski et al.
2005/0009831 A1  1/2005  Ratcliffe et al.
(Continued)

FOREIGN PATENT DOCUMENTS

JP    2004210805 A    7/2004

OTHER PUBLICATIONS

Schlumberger Canada Limited, WO 2012/135406A2, Published Oct. 4, 2012.*
(Continued)

*Primary Examiner* — Suberr L Chi
(74) *Attorney, Agent, or Firm* — Trevor G. Grove

(57) ABSTRACT

A packaged electronic module for downhole applications, in particular in a petrochemical well or similar environment. The electronic module includes one or more electronic components located on each side of a substrate, where the one or more electronic components are attached to the substrate by means of glue.

14 Claims, 2 Drawing Sheets

(51) Int. Cl.
*H01L 23/10* (2006.01)
*H01L 23/28* (2006.01)
*H01L 23/60* (2006.01)

(52) U.S. Cl.
CPC ............. *H01L 2924/15151* (2013.01); *H01L 2924/19041* (2013.01); *H01L 2924/19043* (2013.01)

(56) References Cited

U.S. PATENT DOCUMENTS

| | | |
|---|---|---|
| 2005/0098318 A1 | 5/2005 | Rodney et al. |
| 2007/0015883 A1 | 1/2007 | Hale et al. |
| 2007/0158834 A1 | 7/2007 | Schultz et al. |
| 2008/0011214 A1 | 1/2008 | Stutznacker et al. |
| 2008/0112143 A1 | 5/2008 | Hanley |
| 2010/0212950 A1* | 8/2010 | Sakaguchi ......... G01R 1/07307 174/262 |
| 2013/0008790 A1 | 1/2013 | Updyke et al. |
| 2013/0087903 A1 | 4/2013 | Cherchali et al. |
| 2015/0013004 A1 | 1/2015 | Mangold et al. |
| 2015/0130040 A1 | 5/2015 | Defretin et al. |
| 2016/0247736 A1* | 8/2016 | Kuwahara ............... H01L 23/62 |
| 2019/0001681 A1* | 1/2019 | Matsuo ................ B41J 2/14233 |

OTHER PUBLICATIONS

International Preliminary Report on Patentability issued in the related PCT Application PCT/US2017/016361, dated Aug. 7, 2018 (8 pages).
Extended Search Report issued in the related EP Application 16290025.2, dated Jul. 13, 2016 (6 pages).
Office Action issued in the related EP Application 16290025.2, dated Apr. 10, 2019 (4 pages).
International Search Report and Written Opinion issued in the related PCT Application PCT/US2017/016361, dated Mar. 21, 2017 (11 pages).

* cited by examiner

DOUBLE-SIDED HERMETIC MULTICHIP MODULE

CROSS REFERENCE TO RELATED APPLICATIONS

This application claims priority from and the benefit of PCT Application No. PCT/US2017/016361 filed on Feb. 3, 2017; and European Patent Application 16290025.2, filed on Feb. 4, 2016; all entitled "DOUBLE-SIDED HERMETIC MULTICHIP MODULE", which are herein incorporated by reference in their entireties for all purposes.

BACKGROUND

In downhole or downwell technologies, it is often necessary to have electronic circuitry, sensors, cabling and the like positioned in harsh environments including high temperatures, high pressures and/or the like. In oil and gas wells, not only are the temperature and pressure often considerably greater than at ground level, but in addition the atmosphere can be populated by flammable and corrosive gases. In dealing with such harsh environments, it is typical that electronic components be enclosed in protective shielding or casing to not only protect against the temperatures and pressures, but also to minimize the direct impingement of the gases with the delicate components.

Typical techniques for protecting electronic components and the like in such harsh environments involve mounting components to a substrate, wherein the substrate is either enclosed itself within a protective casing, or a cover or protective casing is mounted onto the substrate holding the electronic components. In order to minimize the space required for such electronic circuitry, it is common to provide a substrate onto which semiconductor dies and other components are mounted to one side by means of a glue, and on a second side surface-mounted components are provided and soldered to the substrate to make appropriate connections there-between. In order to protect the semiconductor dies and die attaches or attachment means, it is common to provide a cavity around the components which is sealed by means of a lid.

FIG. 1 shows a typical double-sided multi-chip module (MCM) wherein a semiconductor die(s) 100 and die attachment means 120 are provided on a first side of a substrate 500 wherein these structures are sealed from the environment by means of a cavity 200 and a lid 300. In particular, it is common to use a ceramic or Kovar ring structure around the electronic components, and then seal the cavity by means of an appropriate lid structure. As further seen in FIG. 1, the second side of the substrate 500 is provided with surface mounted components (SMC) 150A and 150B, soldered to the substrate 500 to form a double-sided MCM.

The current technology as described in FIG. 1 allows for a small footprint and compact unit to be positioned in downhole or wellhead positions. The covering of the surface comprising the semiconductor dies and die attachment means ensures that the delicate electronic components are protected from the harsh environment. It is clear, however, that the lower side, as seen in FIG. 1, will provide no protection to the SMCs when in a downhole environment, and thus the lifetime and reliability of such double-sided MCMs is significantly reduced. Indeed, it is now uncommon to provide such double-sided MCMs in downhole environments for this reason.

The present disclosure relates to the above problems associated with hermetically sealed single-sided MCMs in which the footprint is too large for the small volumes in downhole technologies, as well as the difficulties in utilizing standard double-sided MCMs in the often harsh environments in downhole technologies, especially those producing oil and gas.

BRIEF SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth.

The above-mentioned problems are addressed by the packaged electronic module as defined in independent claim 1. Dependent claims provide preferred embodiments of this electronic module. A method of making an electronic module, in particular that defined in claim 1, is given in independent claim 11. Aspects of the method are given as preferred features in the dependent claims thereto.

Embodiments of the present disclosure provide an electronic module which is packaged and capable of withstanding the harsh environments in downhole applications. The electronic module is provided with a substrate, wherein each side of the substrate comprises one or more discrete electronic components making up the related circuitry. In particular, the electronic components provided on the substrate are attached by means of a glue or epoxy, or similar material. The use of glue to attach both SMCs as well as semiconductor dies and die attachment holders, and the like, on both sides of the substrate allows for a much better temperature stability/performance of the packaged electronic module. The use of glue is particularly advantageous, as after curing such materials can withstand a very wide temperature range without degradation. In particular, such technology can provide satisfactory connection between the electronic components and the substrate at temperatures in excess of 250° C.

Given that the electronic module is intended to be used in high temperature and/or high pressure environments, in some embodiments the substrate is made from a ceramic material. In some embodiments, a high temperature co-fired ceramic (HTCC) is used to provide a stable and robust substrate that is also capable of very high temperature operation.

In order to protect the electronic components, in some embodiments of the present disclosure each side of the substrate may be provided with a metallic and or ceramic ring structure which extends out of the plane of the substrate and surrounds the electronic component. It is preferably for this metallic and or ceramic ring to be firmly and hermetically connected to the substrate, wherein in some embodiments of the present disclosure this can be achieved by brazing, welding or sintering to the ceramic or other material substrate. In some embodiments of the present disclosure the ring may be glued to the substrate using the same glue material as is used for connection of the SMCs and semiconductor dies. Furthermore, the upper edge of the metallic or ceramic ring is adapted in some embodiments of the present disclosure so that it will interact and allow fixing of a lid thereto. The provision of a lid provides an appropriate cavity surrounding the electronic components on the substrate, and allows for this cavity to appropriately protect the electronic components therein.

In some embodiments of the present disclosure, connection of the lid to the upper side or edge of the metallic ring may be achieved by means of brazing, welding, a screw-thread with appropriate seal, a glass frit process if appropriate materials are chosen or indeed gluing the lid to the metallic ring, again by means of the epoxy or glue suitable for the electrical component fixing to the substrates. It is further possible that in some embodiments of the present disclosure a combination of these techniques be used in order to provide an appropriate hermetically sealed cavity in and around the electronic components. In embodiments of the present disclosure, because each side of the substrate may be provided with such a metallic ring and lid structure, all electronic components attached to the substrate will be appropriately protected and shielded from any harsh environment and high temperatures and pressures existing in the downhole applications.

Instead of using metallic rings, even those made from Kovar, in some embodiments of the present disclosure the substrate may be provided integrally formed with ring-like protrusions on either side of the substrate. For example, the substrate may be formed with an "H-like" cross-sectional profile, wherein the middle substrate is then provided with two upstanding surrounding walls, thus forming the cavity into which the electronic components may be positioned. Indeed, in some embodiments of the present disclosure, structuring a ceramic with this H-profile provides a shielded substrate area to which only two lids need to be provided to appropriately structure the double-sided hermetically sealed electronic module. The lid being attached to either side of the substrate and ceramic upstanding walls, where the lid may be soldered, glass frit fitted, glued or brazed/welded to the top of the walls to provide the hermetically sealed cavity.

In some embodiments of the present disclosure, the interior of the cavity may be filled with an inert gas, or other material, in order to protect the electronic components therein. Preferably, in some embodiments of the present disclosure the inert material is non-conductive in order to avoid any potential short-circuits across the electronic components when the module is in use.

One advantage of having both sides of the MCM sealed in accordance with embodiments of the present disclosure, is that the delicate semiconductor dies and integrated circuit(s) (IC) can be positioned on both sides of the substrate. In certain environments and under certain conditions the signaling passing through the semiconductor ICs, and the like, can cause interference with other portions of the electronic module. By allowing both sides of the substrate to be used for both the SMCs and dies, in accordance with some embodiments of the present disclosure, it is possible to avoid the interference between such components. Additionally, such an arrangement provides for miniaturization of the substrate and reduction in the overall size of the electronic module. In order to make appropriate connections between both sides of the substrate, in some embodiments of the present disclosure, the substrate may be provided with feed-through channels through which electronic current and signaling may by passed.

The electronic components being discussed above can take any required form for fulfilling the circuitry requirements in question. For example, the electronic components on the MCM may be discrete electronic components, such as capacitors, resistors, inductors and the like; surface mounted components, SMCs; die components and their attachment means; semiconductor ICs and other Asics and chips. Again, in embodiments of the present disclosure, the above components can be mixed on both sides of the substrate and the architecture can be chosen to reduce the interference effects, therefore assisting in reducing the footprint of the substrate.

In some embodiments of the present disclosure, unlike prior downhole electronic systems, no solder is present in the unit or for fixing any of the components to the substrate. As discussed above, the curing temperature of the glue and epoxy can be rather high so as to ensure the glue will then make a stable bond between the electronic components and the substrate. It is not uncommon for the full curing temperature of useful glue and epoxy materials to be above the melting point of standard solder, thus meaning that, in some embodiments of the present disclosure, either electronic components that are to be attached with solder are attached after those which are attached by glue or epoxy, or the glue is not properly cured. Further, the use of solder can have negative effects when the electronic module is to be used in high temperature and thermal cycling environments, these being obviated by the use of glue or epoxy.

In order to avoid outgassing during use, in some embodiments of the present disclosure the glue is fully cured and all solvent is removed prior to the packaging of the electronic module and sealing of the lid around the metallic or ceramic ring. This may be achieved by means of use of a glue that has a low solvent content, or a glue that has a zero content or zero outgassing at the expected temperature uses of the electronic module. In some embodiments of the present disclosure, glues based on polyimide technology are used.

A method for producing the above electronic module may comprise the step of providing the substrate, preferably a ceramic substrate as discussed above, onto which electrical components are glued onto both sides of the substrate. Once the electronic components are positioned and glued on the substrate within the electronic module, the glue can be appropriately cured and the components properly fixed to the substrate.

In some embodiments of the present disclosure, the substrate may be provided as discussed above with an H-profile at the outset, wherein the electronic components are then mounted and stuck within the recess or bowl formed between the extending ring around the edge of the substrate. In other embodiments, prior to affixing the electronic components to the substrate a metallic/ceramic ring may be affixed to both sides of the substrate. The fixing of the metallic/ceramic ring, preferably a ring made from Kovar, may be performed by one of brazing, welding or indeed gluing each of the rings to the substrate surface. Positioning the ring prior to the positioning of the electronic components is advantageous, as it both provides a working area in which to mount the components, and also avoid that the attachment of the ring in some way damages the components on the substrate.

Once the ring is fixed to each side of the substrate, and the electronic components are appropriately mounted and connected together as desired within the volume provided by the ring or sidewalls, which may be metallic, ceramic and/or the like, the assembly can be held within an inert gas atmosphere and a lid appropriately attached to the top of the ring/sidewall to form the hermetic enclosure. If necessary, the inert gas can be held under pressure such that the gas trapped within the cavity is also under pressure, which may assist when positioning the cavity in a high-pressure environment. Indeed, in some embodiments of the present disclosure, the pressure of the gas within the cavity can be tailored as required and with knowledge of the expected temperature and pressure environment into which the electronic module will be placed.

In embodiments of the present disclosure, solder is not used in affixing any aspect of the structure to the substrate, thus avoiding the temperature problems which solder may bring. Further, it is known that solder can outgas at moderate temperatures, which may also lead to problems in the environments where the packaged electronic module is to be utilized.

DESCRIPTION OF THE FIGURES

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

Figure 1:
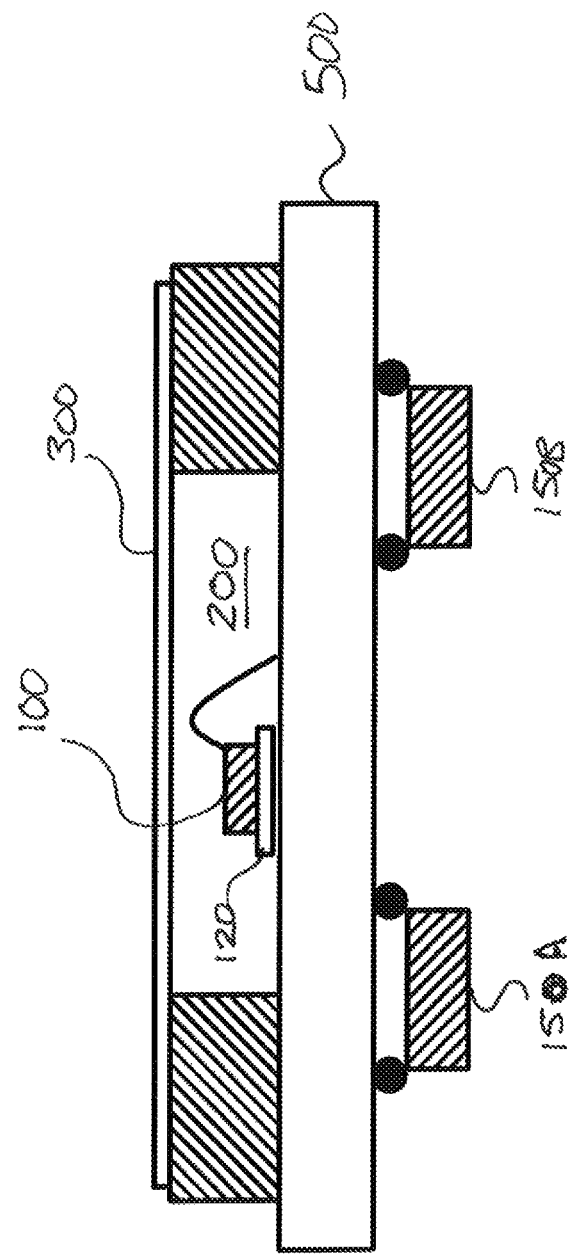
FIG. 1 illustrates a prior art double-sided MCM.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only, and is not intended to limit the scope, applicability or configuration of the invention. Rather, the ensuing description of the preferred exemplary embodiment(s) will provide those skilled in the art with an enabling description for implementing a preferred exemplary embodiment of the invention. It being understood that various changes may be made in the function and arrangement of elements without departing from the scope of the invention as set forth in the appended claims.

Specific details are given in the following description to provide a thorough understanding of the embodiments. However, it will be understood by one of ordinary skill in the art that the embodiments maybe practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
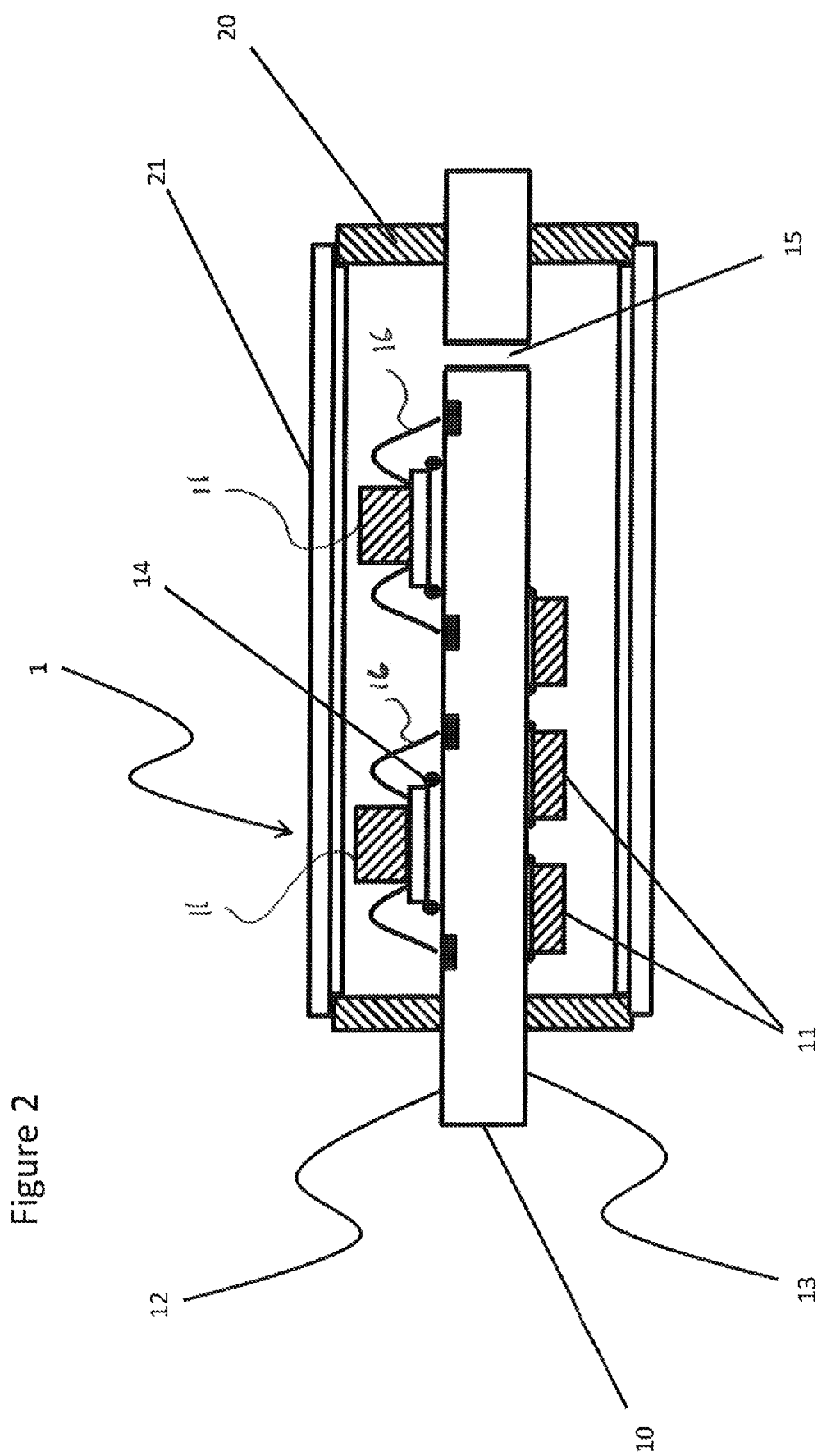
FIG. 2 illustrates a double-sided hermetically sealed MCM in accordance with embodiments of the present disclosure.

FIG. 2 shows a cross-section of an electronic module 1 according to some embodiments of the present disclosure. Elements of the electronic module 1 can be seen in cross-section, and the disclosure in FIG. 2 is not meant to be considered in a limiting fashion with regard to positioning and number of the electronic components 11. Furthermore, the electronic components 11 are not shown to scale in FIG. 2.

As illustrated in FIG. 2, the electronic module 1 is provided with a substrate 10 onto which the electronic components 11 are mounted. The electronic components may comprise capacitors, resistors, amplifiers, digital to analogue converters, semiconductors, ICs, an application-specific integrated circuit (Asic), dies and/or the like. The substrate 10 is not limited in size or shape, and is of course chosen for the particular application required. As can be seen from FIG. 2, the substrate 10 preferably has electronic components 11 mounted on each surface 12, 13 of the substrate 10.

As shown in FIG. 2, certain of the electronic components 11 are provided with wiring 16 which runs to the surface 12, 13 of the substrate 10. Not all of the electronic components 11 require such wiring, and indeed certain electronic components 11 may connect to electronic wiring patterns (not shown) on one or other of the surfaces 12, 13 of the substrate 10. The nature of connection and patterning of the substrate 1 by means of such wiring is not limiting in this case, and any known technology and technique or indeed wiring pattern can be considered.

Whilst in FIG. 2 the components 11 on the surface 12 of the substrate 10 are provided with the wiring 16 to the surface 12, this is not intended as a limitation. Indeed, it is a beneficial aspect of the present application that the electronic components 11 may be positioned on either surface 12, 13 of the substrate 10. As such, in embodiments of the present disclosure, semiconductor ICs, Asics and other dies may like other electronic components be positioned on either the surface 12 or the surface 13 of the substrate 10.

The nature of the electronic components 11 is not limiting, and any required electronic components 11 for meeting the desired application of the electronic module 1 can be included on the surfaces 12, 13 of the substrate 10. In particular, the electronic components 11 may be discrete electronic components, surface mounted components, SMCs, die components, semiconductor ICs and the like. One advantage of the present disclosure is that there is no need to separate out the electronic components 11 onto one or other of the surfaces 12, 13 of the substrate 10, and the electronic components 11 may be positioned in order to provide the smallest footprint without any interference between one or other of the electronic components 11.

As shown in FIG. 2, the electronic components 11 may be attached to the surfaces 12, 13 of the substrates 10 by means of a glue 14. The glue 14 is particularly advantageous in the electronic module 1, as it allows for easy placement of the electronic components 11. Furthermore, the choice of glue 14 or epoxy or other adhesive compound, can be chosen for the end environment for the electronic module 1. The electronic module 1 may be designed for/used in a harsh environment, which may be subjected to high temperatures and pressure. The choice of glue 14 is generally open, however, in some embodiments of the present disclosure, the glue 14 may comprise a glue that has a low or zero solvent content, so that outgassing does not become a problem under high or low pressures and temperatures. Furthermore, the glue 14 will typically have a better temperature response when the substrate 10 expands or contracts in different temperature and pressure environments, thus minimizing the drop-off of electronic components 11 from the surfaces of the substrate 10.

The substrate 10 in some embodiments of the present disclosure is formed from a ceramic material, wherein the ceramic provides an inert substrate material which is well chosen for the harsh environments in wellbore technologies and applications. In particular, in some embodiments of the present disclosure, the substrate 10 may comprise, a high temperature co-fired ceramic (HTCC). As further seen in FIG. 2, connections between the electronic components 11 on the upper side 12 of the substrates 10 to the lower side 13 can be achieved by means of feedthroughs 15. The positioning of feedthroughs 15 is based on the desired structuring and positioning of the electronic components 11, and in certain circumstances the feedthroughs 15 will not even be required.

As discussed above, the electronic components 11 are glued or stuck to the surfaces 12, 13 of the substrate 10. In some embodiments of the present disclosure, none of the electronic components 11 are soldered to the surfaces 12, 13 of the substrates 10. Solder is sometimes useful for making electric connections, in other circumstances, however, it is not a particularly temperature stable material. Further, the choice of glue 14 usually requires that in order to properly cure the glue 14 it is necessary to heat the electronic module 1 to high temperatures, sometimes higher than the temperatures which the electronic module 1 will be subject to in use. The solder material can under such circumstances melt or become unstable, thus meaning that if solder is used, it is not possible to fully cure the glue 14 and the components 11 may not be properly attached to the substrates 10.

In order to properly protect the electronic components 11 from the environment in use, a cover surrounding the electronic components 11 on the substrates 10 is provided. The embodiment shown in FIG. 2 shows sidewalls 20. The sidewalls 20 may comprise a metallic ring structure, wherein the metallic ring is positioned generally toward the outer edge of the substrate 10. Further, a ceramic ring structure could be used instead of, or in addition to, the metallic ring to form the sidewalls 20. The positioning of the sidewalls 20 is chosen by means of the end use of the electronic module 1, and may not cover the entire surface of the substrate 10. It is advantageous for the sidewalls 20 to be brazed, welded or indeed glued to the substrate 10, and in particular to be affixed to the substrates 10 prior to attachment of the electronic components 11.

In order to complete the cover over the electronic components 11, a lid 21 is provided which interacts with the sidewalls 20 in order to provide a hermetic and fluid-tight seal. The lid 21 may be welded, brazed, sintered, screwed, connected by a glass frit process or even glued to the upper ends of the sidewalls 20, thus leading to the hermetic seal. Additionally, the cavity formed between the substrates 10, the sidewalls 20 and the lid 21 can be filled with an inert gas or other material so as to avoid any reaction with the electronic components 11 when the electronic module 1 is in position and in use.

An alternative embodiment to using a metal or ceramic ring structure to form the sidewalls 20 is to use a substrate 10 that has the sidewalls 20 formed/integrated therein and extending out of the plane of the substrate 10 replacing the ring structure. The sidewalls 20 may comprise a ceramic/metallic material and would perform the same purpose as the structure. Again, the lid 21 would be attached to the top edge of the integrated sidewalls, thus providing for the generation of the cavity. In some embodiments of the present disclosure, the substrate 10 is configured such that the sidewalls 20 comprise an H profile to the cross-section of the substrate 10. In some embodiments of the present disclosure, the substrate 10 and the sidewalls 20 are integrated at manufacture to provide a substrate with an H-shaped profile, i.e., sidewalls projecting out from either surface of the substrate. The electronic components 11 can then be mounted within the recesses formed on either side of the central flat interior substrate portion.

The electronic module 1 shown in FIG. 2 can be produced as generally discussed above, and relates to the provision of the substrate 10 either as a flat substrate 10, or as the H-profile substrate 10. In embodiments of the present disclosure, the electronic components 11 are mounted within the central region of the substrates 10, and this is either within the preformed sidewalls from the substrate material, or after provision of the metallic ring sidewalls. The electronic components 11 are glued into and onto the substrate 10 at the desired locations, wherein these locations are determined by means of the eventual requirements from the circuitry, as well as the desire to keep the footprint as small as possible whilst minimising interference between neighbouring components.

After the electronic components 11 have been positioned onto the substrate 10, the glue 14 or epoxy or the like, is appropriately cured at a high temperature. As a result of this curing process at high temperature, solder may not be used in the fixing of the electronic components 11 to the substrates 10. The cured glue 14 or epoxy then has a good bonding strength with the substrate 10, however the lack of solder means that no detrimental effects will arise by means of the solder being over heated. In embodiments of the present invention, the electronic components 11 are either contacted to preformed circuitry on the substrate 10, or can be wire bonded to this circuitry as required. In some embodiments, by performing the final steps under an inert atmosphere, it is possible to then apply a lid 21 to the sidewalls 20, thus enclosing the circuitry and electronic components 11 in said inert atmosphere.

The electronic module 1 as described above, and as constructed by the above method, was tested at a temperature of around 230 degrees centigrade for 1500 hours, and it was found that there were no negative effects to any of the electronic components 11. Such an electronic module 1 thus has an expected lifetime of at least 5 years in an environment of 200° C., which is over and above that expected from the prior art double-sided MCMs shown in FIG. 1. Moreover, curing temperatures of over 200, 210, 220, 230, 240 or even 250 degrees centigrade may be used to cure glues attaching the electronic components 11 to the substrate 10. Additionally by hermetically sealing both sides of the substrate 10, semiconductor ICs, dies, Asics and/or the like may be disposed on either side of the substrate reducing size of the substrate, allowing the substrate to serve as a shield between the components, allowing gluing of components to both sides of the substrate 10 and/or the like. Use of glue for attachment of all electrical components may avoid issues with soldering/forming electrical connections on a ceramic substrate.

Whilst the above has been described in detail, it should not be taken as a limiting combination of features. Indeed, it is to be understood that the above describes a number of features of both the electronic module 1 and method of making the same, however the skilled would be well aware of the possibility of combining one or other of the aspects into a final electronic module 1. Additionally, whilst method steps have been provided, the skilled person would also appreciate that alternatives exist, wherein these alternatives are covered by the claims attached.

The invention claimed is:

1. A method of making an electronic module, the method comprising:
   providing a substrate, wherein the substrate comprises a plurality of integrated sidewalls extending from surfaces of the substrate and providing the substrate with an H-shape profile, wherein the surfaces of the substrate from which the plurality of integrated sidewalls extends comprise a first surface and a second surface that are opposed to one another, the plurality of integrated sidewalls comprises a first set of integrated sidewalls and a second set of integrated sidewalls, and the first set of integrated side walls extends outwardly from the first surface of the substrate and the second set of integrated side walls extends outwardly from the second surface of the substrate such that the first set of integrated sidewalls does not contact the second set of integrated sidewalls;
   gluing one or more electrical components to each side of the substrate;
   curing the glue; wherein at least one of the one or more electrical components comprises a multi-chip module and includes one or more of: discrete electronic components; surface mounted components; semiconductor integrated circuits; or semiconductor chips; and
   covering the one or more electrical components by attaching a pair of lids to the plurality of integrated sidewalls, wherein a cavity is formed between the plurality of integrated sidewalls, the substrate, and the pair of lids.

2. The method according to 1, further comprising:
   adding an inert gas inside the cavity.

3. The method according to claim 1, wherein curing the glue comprises heating the glue to a temperature above 200° C.

4. The method according to claim 1, wherein the glue does not produce outgassing during or after curing.

5. The method according to claim 1, wherein the glue comprises a polyimide.

6. The method according to claim 1, wherein the glue comprises a solvent, wherein curing the glue comprises fully curing the glue and removing the solvent therefrom prior to attaching the pair of lids to the plurality of integrated sidewalls.

7. The method according to claim 1, wherein the substrate defines a feed-through channel extending from each side of the substrate, and wherein at least one of the one or more electrical components located on a first side of the substrate is electrically connected to at least one of the one or more electrical components located on a second side of the substrate through the feed-through channel.

8. The method according to claim 1, wherein the at least one of the one or more electrical components comprises the multi-chip module and includes the discrete electronic components.

9. The method according to claim 1, wherein the at least one of the one or more electrical components comprises the multi-chip module and includes the surface mounted components.

10. The method according to claim 1, wherein the at least one of the one or more electrical components comprises the multi-chip module and includes the semiconductor integrated circuits.

11. The method according to claim 1, wherein the at least one of the one or more electrical components comprises the multi-chip module and includes the semiconductor chips.

12. A method of making an electronic module, the method comprising:
   providing a substrate, wherein the substrate comprises a plurality of integrated sidewalls extending from surfaces of the substrate and providing the substrate with an H-shape profile:
   gluing one or more electrical components to each side of the substrate, wherein the glue comprises a solvent, wherein curing the glue comprises fully curing the glue and removing the solvent therefrom prior to attaching the pair of lids to the plurality of integrated sidewalls;
   curing the glue; wherein at least one of the one or more electrical components comprises a multi-chip module and includes one or more of: discrete electronic components; surface mounted components; semiconductor integrated circuits; or semiconductor chips; and
   covering the one or more electrical components by attaching a pair of lids to the plurality of integrated sidewalls, wherein a cavity is formed between the plurality of integrated sidewalls, the substrate, and the pair of lids.

13. The method according to claim 12, wherein:
the surfaces of the substrate from which the plurality of integrated sidewalls extends comprise a first surface and a second surface that are opposed to one another,
the plurality of integrated sidewalls comprises a first set of integrated sidewalls and a second set of integrated sidewalls, and
the first set of integrated side walls extends outwardly from the first surface of the substrate and the second set of integrated side walls extends outwardly from the second surface of the substrate such that the first set of integrated sidewalls does not contact the second set of integrated sidewalls.

14. A method of making an electronic module, the method comprising:
providing a substrate, wherein the substrate comprises a plurality of integrated sidewalls extending from surfaces of the substrate and providing the substrate with an H-shape profile; wherein the substrate defines a feed-through channel extending from each side of the substrate, and wherein at least one of the one or more electrical components located on a first side of the substrate is electrically connected to at least one of the one or more electrical components located on a second side of the substrate through the feed-through channel;
gluing one or more electrical components to each side of the substrate, wherein the glue comprises a solvent, wherein curing the glue comprises fully curing the glue and removing the solvent therefrom prior to attaching the pair of lids to the plurality of integrated sidewalls;
curing the glue; wherein at least one of the one or more electrical components comprises a multi-chip module and includes one or more of: discrete electronic components; surface mounted components; semiconductor integrated circuits; or semiconductor chips; and
covering the one or more electrical components by attaching a pair of lids to the plurality of integrated sidewalls, wherein a cavity is formed between the plurality of integrated sidewalls, the substrate, and the pair of lids.

* * * * *